(12) United States Patent
Roh et al.

(10) Patent No.: US 11,233,602 B2
(45) Date of Patent: *Jan. 25, 2022

(54) CODE BLOCK SEGMENTATION AND CONFIGURATION FOR CONCATENATED TURBO AND RS CODING

(71) Applicant: Texas Instruments Incorporated, Dallas, TX (US)

(72) Inventors: June Chul Roh, Allen, TX (US); Pierre Bartand, Antibes (FR)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/298,560

(22) Filed: Mar. 11, 2019

(65) Prior Publication Data

US 2019/0207703 A1 Jul. 4, 2019

Related U.S. Application Data

(63) Continuation of application No. 15/462,719, filed on Mar. 17, 2017, now Pat. No. 10,230,493, which is a (Continued)

(51) Int. Cl.
*H04L 1/00* (2006.01)
*H03M 13/09* (2006.01)
(Continued)

(52) U.S. Cl.
CPC ............ *H04L 1/004* (2013.01); *H03M 13/09* (2013.01); *H03M 13/1515* (2013.01);
(Continued)

(58) Field of Classification Search
CPC .. H03M 13/27; H03M 13/635; H03M 13/618; H03M 13/6516; H03M 13/2966;
(Continued)

(56) References Cited

U.S. PATENT DOCUMENTS 6,445,702 B1 9/2002 Wright
7,260,332 B1 8/2007 Hayee
(Continued)

OTHER PUBLICATIONS

"3rd Generation Partnership Project; Technical Specification Group Radio Access Network; Evolved Universal Terrestrial Radio Access (E-UTRA); Physical Channels and Modulation (Release 12)," 3GPP TS 36.211, V12.5.0, Mar. 2015, 136 pages.
(Continued)

*Primary Examiner* — Shelly A Chase
(74) *Attorney, Agent, or Firm* — Gregory J. Albin; Charles A. Brill; Frank D. Cimino

(57) ABSTRACT

A method for performing code block segmentation for wireless transmission using concatenated forward error correction encoding includes receiving a transport block of data for transmission having a transport block size, along with one or more parameters that define a target code rate. A number N of inner code blocks needed to transmit the transport block is determined. A number M-outer code blocks may be calculated based on the number of inner code blocks and on encoding parameters for the outer code blocks. The transport block may then be segmented and encoded according to the calculated encoding parameters.

20 Claims, 10 Drawing Sheets

Related U.S. Application Data continuation of application No. 14/749,030, filed on Jun. 24, 2015, now Pat. No. 9,602,235.

(60) Provisional application No. 62/018,130, filed on Jun. 27, 2014.

(51) Int. Cl.
   *H03M 13/15* (2006.01)
   *H03M 13/27* (2006.01)
   *H03M 13/29* (2006.01)
   *H03M 13/00* (2006.01)
   *H04L 1/18* (2006.01)
   *H04L 27/26* (2006.01)
   *H04W 84/04* (2009.01)

(52) U.S. Cl.
   CPC ....... *H03M 13/27* (2013.01); *H03M 13/2792* (2013.01); *H03M 13/2906* (2013.01); *H03M 13/2966* (2013.01); *H03M 13/618* (2013.01); *H03M 13/635* (2013.01); *H03M 13/6516* (2013.01); *H04L 1/0041* (2013.01); *H04L 1/0045* (2013.01); *H04L 1/0057* (2013.01); *H04L 1/0061* (2013.01); *H04L 1/0064* (2013.01); *H04L 1/0066* (2013.01); *H04L 1/0071* (2013.01); *H04L 1/1812* (2013.01); *H04L 27/26* (2013.01); *H04L 1/0075* (2013.01); *H04W 84/042* (2013.01)

(58) Field of Classification Search
   CPC ..... H04L 1/004; H04L 1/0045; H04L 1/0057; H04L 1/0066; H04L 1/0071
   See application file for complete search history.

(56) References Cited

U.S. PATENT DOCUMENTS

| | | | |
|---|---|---|---|
| 7,616,636 B2 * | 11/2009 | Ben Rached | H03M 13/09 370/392 |
| 8,310,981 B2 * | 11/2012 | Damnjanovic | H04L 1/0026 370/319 |
| 8,824,373 B2 | 9/2014 | Seo et al. | |
| 8,996,949 B2 * | 3/2015 | Hansen | H04B 7/0689 714/755 |
| 9,491,745 B2 | 11/2016 | Cheng et al. | |
| 9,602,235 B2 | 3/2017 | Roh et al. | |
| 2007/0089025 A1 | 4/2007 | Hong et al. | |
| 2010/0262886 A1 | 10/2010 | Ren | |
| 2012/0063523 A1 | 3/2012 | Jitsukawa et al. | |
| 2013/0016687 A1 | 1/2013 | Yang et al. | |

OTHER PUBLICATIONS

"3rd Generation Partnership Project; Technical Specification Group Radio Access Network; Evolved Universal Terrestrial Radio Access (E-UTRA); Multiplexing and Channel Coding (Release 12)," 3GPP TS 36.212, V12.4.0, Mar. 2015, 94 pages.

"Reed-Solomon error correction," Wikipedia, http://en.wikipedia.org/wiki/Reed%E2%80%93Solomon_error_correction, May 1, 2015, 13 pages.

"Turbo code," Wikipedia, http://en.wikipedia.org/wiki/Turbo_code, May 1, 2015, 7 pages.

Mansour, et al., "Forward Error Control Coding," U.S. Appl. No. 14/580,622, filed Dec. 23, 2014, 16 pages.

Patent Prosecution History from U.S. Appl. No. 15/462,719, dated Mar. 17, 2017 to Feb. 21, 2019 (196 pages).

Patent Prosecution History from U.S. Appl. No. 14/749,030, dated Jun. 24, 2015 to Mar. 2, 2017 (123 pages).

* cited by examiner

CODE BLOCK SEGMENTATION AND CONFIGURATION FOR CONCATENATED TURBO AND RS CODING

CLAIM OF PRIORITY UNDER 35 U.S.C. 119(e)

The present application is a continuation of U.S. application Ser. No. 15/462,719 filed Mar. 17, 2017, which is a continuation of U.S. application Ser. No. 14/749,030 filed Jun. 24, 2015, now U.S. Pat. No. 9,602,235 issued Mar. 21, 2017 in which claims priority to and incorporates by reference U.S. Provisional Application No. 62/018,130, filed Jun. 27, 2014, entitled "Code Block Segmentation And Configuration For Concatenated Turbo And RS Coding."

FIELD OF THE DISCLOSURE

This disclosure generally relates to wireless communication, and in particular to transmission of blocks of data using forward error detection (FEC).

BACKGROUND OF THE DISCLOSURE

Wireless cellular communication networks incorporate a number of mobile user devices and a number of NodeBs. A NodeB is generally a fixed station, and may also be called a base transceiver system (BTS), an access point (AP), a base station (BS), or some other equivalent terminology. As improvements of networks are made, the NodeB functionality evolves, so a NodeB is sometimes also referred to as an evolved NodeB (eNB). In general, NodeB hardware, when deployed, is fixed and stationary, while the user equipment hardware is portable.

In contrast to NodeB, the mobile user equipment can comprise portable hardware. User equipment (UE), also commonly referred to as a terminal or a mobile station, may be fixed or mobile device, and may be a wireless device, a cellular phone, a personal digital assistant (PDA), a wireless modem card, and so on. Uplink communication (UL) refers to a communication from the mobile UE to the NodeB, whereas downlink (DL) refers to communication from the NodeB to the mobile UE. Each NodeB contains radio frequency transmitter(s) and the receiver(s) used to communicate directly with the mobiles, which move freely around it. Similarly, each mobile UE contains radio frequency transmitter(s) and the receiver(s) used to communicate directly with the NodeB. In cellular networks, the mobiles cannot communicate directly with each other but have to communicate with the NodeB.

Wireless users require high-speed connections that support real time video, streaming music, and other multimedia applications. As a result, demands on wireless networks approach the broadband speeds and user experience provided by traditional DSL and cable modem wireline service. Wireless networks continue to evolve to next-generation packet architectures capable of supporting enhanced broadband connections with the introduction of 4G systems.

The higher speeds and capacity provided by 4G wireless networks put strain on backhaul networks and the carriers providing backhaul services as the transport requirements increase. Providers are shifting from traditional TDM transport in 2G and 3G networks to packet transport to support higher data rates, reduce network latency, and support flexible channel bandwidths in 4G networks. The backhaul networks require efficient Bit-Error-Rate (BER) performance to support 4G mobile networks.

Error-control coding techniques may detect and possibly correct errors that occur when messages are transmitted in a communication channel. To accomplish this, the encoder transmits not only the information symbols but also extra redundant parity symbols. The decoder interprets what it receives, using the redundant symbols to detect and possibly correct whatever errors occurred during transmission.

Block coding is a special case of error-control coding. Block-coding techniques map a fixed number of message symbols to a fixed number of code symbols. A block coder treats each block of data independently and is a memory-less device. The information to be encoded consists of message symbols and the code that is produced consists of codewords. Each block of K message symbols is encoded into a codeword that consists of N message symbols. K is called the message length, N is called the codeword length, and the code is called an [N,K] code.

Turbo codes are a class of high-performance error correction codes developed in 1993 which are finding use in deep space satellite communications and other applications where designers seek to achieve maximal information transfer over a limited-bandwidth communication link in the presence of data-corrupting noise. The channel coding scheme for transport blocks in LTE is Turbo Coding with a coding rate of R=1/3, using two 8-state constituent encoders and a contention-free quadratic permutation polynomial (QPP) turbo code internal interleaver. Trellis termination is used for the turbo coding. Before the turbo coding, transport blocks are segmented into byte aligned segments with a maximum information block size of 6144 bits. Error detection is supported by the use of 24 bit CRC. The 1/3 coding rate triples the bit-count for transmission of the block. In LTE, a circular buffer rate matching (CBRM) technique is used in which the systematic bits and the parity bits are placed in a circular buffer. During readout for a selected code rate, if the end of the buffer is reached reading continues by wrapping around to the beginning of the buffer. The general operations of channel coding are described in the EUTRA specifications, for example: "$3^{rd}$ Generation Partnership Project; Technical Specification Group Radio Access Network; Evolved Universal Terrestrial Radio Access (E-UTRA); Multiplexing and channel coding (TS36.212, Release 12.4)," which is incorporated by reference herein.

BRIEF DESCRIPTION OF THE DRAWINGS

Particular embodiments in accordance with the disclosure will now be described, by way of example only, and with reference to the accompanying drawings.

Figure 1:
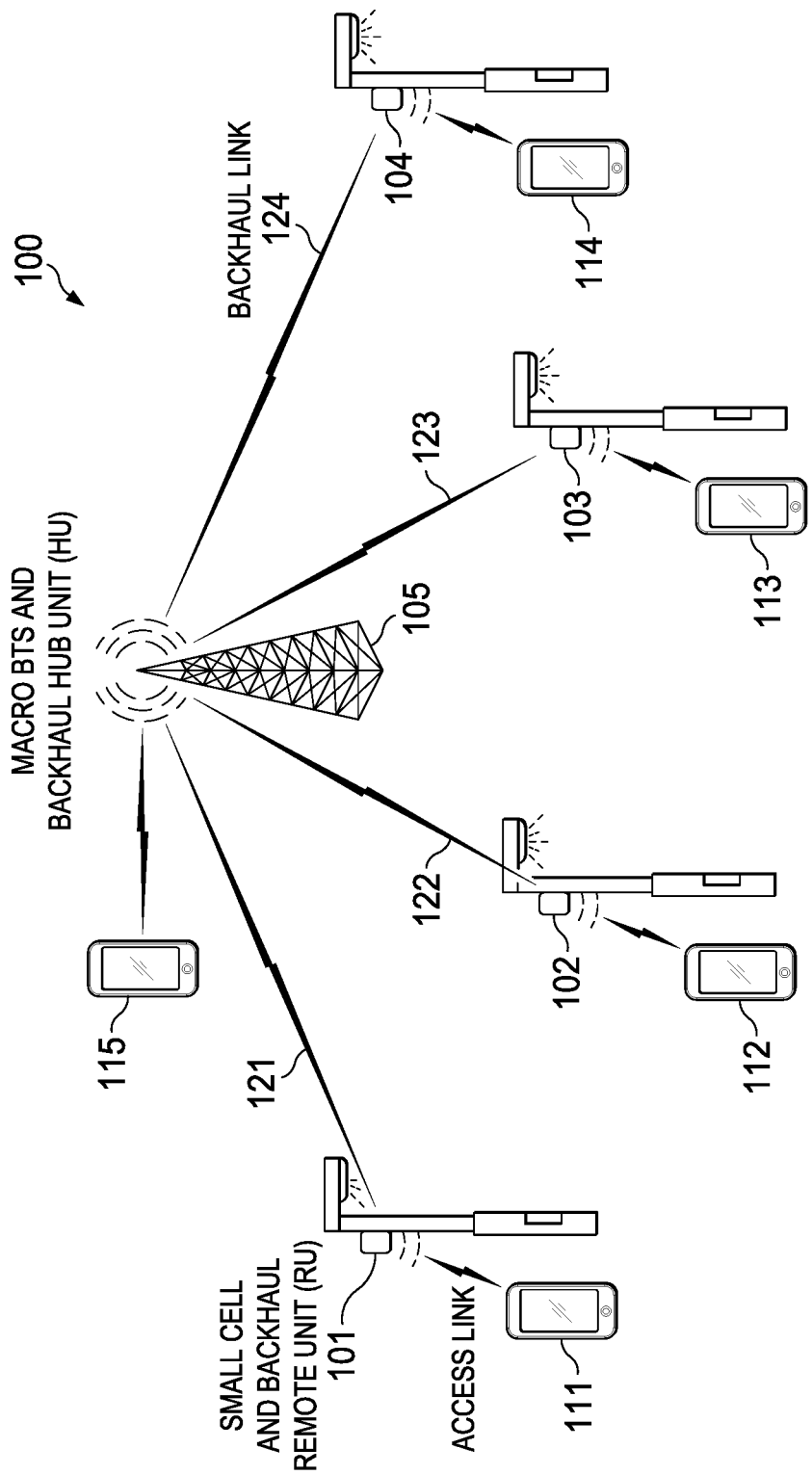
FIG. 1 is an illustration of a portion of a cellular network that utilizes wireless backhaul links between radio access network (RAN) nodes.

Other features of the present embodiments will be apparent from the accompanying drawings and from the detailed description that follows.

DETAILED DESCRIPTION OF EMBODIMENTS OF THE DISCLOSURE

Specific embodiments of the disclosure will now be described in detail with reference to the accompanying figures. Like elements in the various figures are denoted by like reference numerals for consistency. In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

The robustness and tight latency requirements in certain communication systems may be addressed by improving the popular Turbo-code based FEC (forward error correction) scheme (e.g., in WiMax, 3G, LTE) with an additional low-overhead Reed Solomon (RS) outer code. The concatenated coding scheme allows achieving very low BLER (block error rate). Hybrid ARQ (automatic repeat request) (HARQ) may be applied on top of concatenated Turbo and RS coding scheme for robustness. The FEC scheme disclosed herein may minimize the required number of HARQ retransmissions, and thereby reduce latency.

This disclosure describes a FEC code block segmentation and configuration method for concatenated Turbo and RS (Reed-Solomon) coding. In particular, this disclosure describes methods of generating FEC parameters as part of a MCS (modulation coding scheme) based on a TBS (transport block size) received as an input parameter for a communication system that employs a concatenated Turbo and RS coding scheme. The methods may be easily applied to other concatenated coding schemes as well, including, for example: concatenated convolutional code+RS coding, convolutional code+BCH coding, etc.

FIG. 1 is highly simplified block diagram of a system 100 which is part of a cellular communications network, such as a 3GPP Long Term Evolution (LTE) network. Base stations 101-105 serve user equipment (UE) 111-115 and other devices (not shown). Base stations 101-105 may be, for example, LTE eNodeBs. In this example, base stations 101-104 may be remote units (RU) that may be deployed to create small cells for use in a home, business, sports venue, etc. In this example, RU 101-104 are mounted on light poles, for example. Base station 105 is a macro BTS that may also act has a backhaul hub unit (HU) for RUs 101-104, for example.

Wireless backhaul links 121-124 allow RUs 101-104 to communicate with BTS 105, for example. Wireless backhaul links may also be used to allow BTS 105 to communicate with other BTSs in the cell network, and/or with a core network access point, for example.

Channel coding between base stations and UEs in an LTE network includes CRC and turbo coding schemes. LTE adopts turbo coding as the channel coding for the Physical Downlink Shared Channel (PDSCH), for example. Turbo coding provides sufficient bit error rate (BER) for communications between base stations and UEs, but a more efficient BER is required for backhaul links 121-124. In general, for a RAN application illustrated in FIG. 1, it is desirable that the wireless backhaul links have a very low BLER and low latency. A target BLER=$10^-6$ for example, as compared to BLER=0.1–0.01 for RAN links to the mobile devices. Turbo code alone cannot meet the low BLER requirement due to an error floor in a high SNR environment. Concatenating an RS code to the turbo code allows meeting the low BLER requirement.

The general operation of the physical channels is described in the EUTRA specifications, such as: "$3^{rd}$ Generation Partnership Project; Technical Specification Group Radio Access Network; Evolved Universal Terrestrial Radio Access (E-UTRA); Physical Channels and Modulation (TS36.211, Release 12.5.0)," which is incorporated by reference herein, for example.

Because turbo coding processors are already present in LTE base stations for use in UE communications, this available hardware may be incorporated into the design of error control coding for backhaul systems. LTE turbo codes may be used as the core part for error control coding. To cope with the error floor for turbo codes at high Signal-to-Noise Ratio (SNR), an outer code may be used to remove the residual errors of turbo codes. In embodiments disclosed herein, a Reed Solomon (RS) block code is selected as the outer code for a Forward Error Correction (FEC) system. RS code offers excellent error correcting capability and has the maximum code rate for the number of corrected symbols.

In coding theory, the Reed-Solomon code belongs to the class of non-binary cyclic error correcting codes. It is able to detect and correct multiple symbol errors. By adding P check symbols to the data, a Reed-Solomon code can detect any combination of up to P erroneous symbols, or correct up to $\lfloor P/2 \rfloor$ symbols. As an erasure code, it can correct up to P known erasures, or it can detect and correct combinations of errors and erasures. Furthermore, Reed-Solomon codes are suitable as multiple-burst bit-error correcting codes, since a sequence of b+1 consecutive bit errors can affect at most two symbols of size b. The choice of P is up to the designer of the code, and may be selected within wide limits. The general operation of RS coding is well known, see, e. g. "Reed-Solomon error correction", Wikipedia, last modified Apr. 21, 2015.

Figure 2:
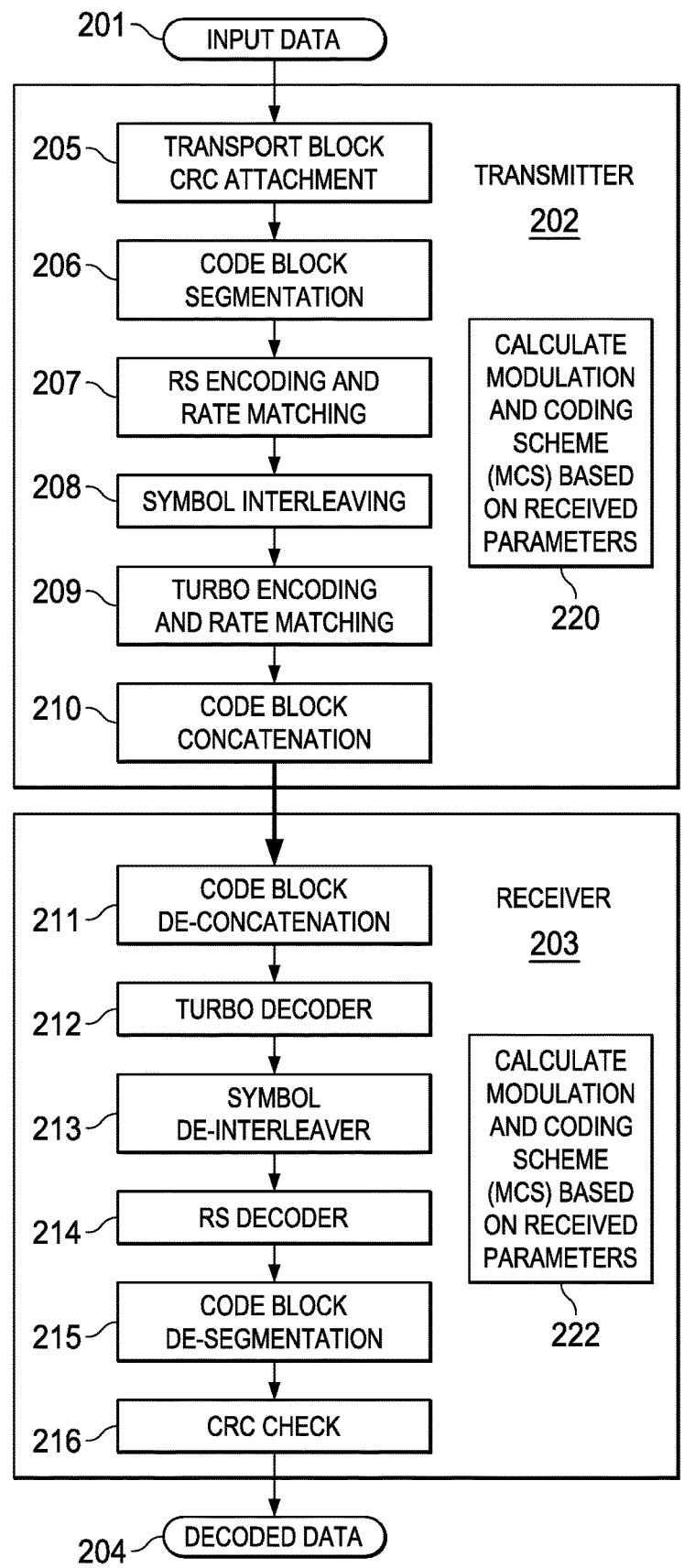
FIG. 2 is a block diagram of a system using a combination of RS coding and turbo coding.

FIG. 2 is a block diagram of a system using a combination of RS coding and turbo coding according to one embodiment. Input data 201 is received at transmitter 202, which applies FEC coding and transmits the data to receiver 203. Receiver 203 decodes the data to generate received decoded data 204. Transmitter 202 may be in backhaul RU 101, for example, and may use FEC for data sent over backhaul link 121 to backhaul HU 105 which includes receiver 203, for example.

Input data 201 may be accompanied by a small set of parameters, such as: the block size, which is the number of input bits; a scheduled allocation size that defines the number of resource elements that may be used on the wireless transmission channel; and the modulation order that specifies the type of modulation to be used. In this embodiment, the set of parameters may be received via a control channel from a higher level control function. In another embodiment, the set of parameters may be included with the transport block, or be provided to a control function for the transmitter from a higher level control function using an available communication technique, for example. These parameters may then be used to compute 220 a modulation coding scheme (MCS) that will be used to encode the input data for transmission. Calculation of the MCS parameters will be described in more detail below.

Transmitter 202 may add a CRC (cyclic redundancy check) in block 205, then segment the data into code blocks in block 206, and then perform RS encoding in block 207. To improve concatenation gain, a symbol interleaver 208 may be used between turbo encoder 209 and the RS encoder 207 so that symbol errors from the turbo code are dispersed among more than one RS code block. In one embodiment, turbo encoder 209 may be a hardware turbo accelerator in an LTE base station or RU, for example.

The CRC parity bits and turbo encoding of the input blocks may be performed using DSP hardware, for example. Software instructions on the DSP may be used to create the RS encoded blocks and interleave the RS blocks. The size of the RS blocks may be selected to match the input block size of the turbo coder so that an integer number of RS blocks are interleaved to create the turbo coder input blocs so that an integer number of RS blocks are interleaved to create the turbo coder input blocks. The CRC parity bits and the turbo encoder operation may be compatible with the LTE standard.

The RS encoder 207 and symbol interleaver 208 may be performed by software on a same DSP (digital signal processor). In one embodiment, a single DSP core may be dedicated to FEC processing to minimize data transfer among components in the transmitter.

The turbo encoding may be performed using a bit rate coprocessor hardware accelerator. An LTE rate matching module may be used to generate the exact output block size as calculated for the MCS based on the received transfer parameters. The RS encoder may use shortened RS blocks, as described in more detail below.

The output of turbo decoder 209 may be concatenated 210 to form a single transport block, modulated and then transmitted to receiver 203 over a wireless backhaul link, as described above.

In some embodiments, a CRC field may be generated for each encoded turbo block, such that the concatenated turbo+ RS code FEC blocks are further protected. In some embodiments, a CRC field may be generated for the entire encoded transport block. In either case, the rate matching calculations must be adjusted to compensate for the extra CRC bits.

Receiver 203 decodes the data received from transmitter 202. Received signals are processed by turbo decoder 2212 after being deconcateated 211 and then by symbol de-interleaver 213. The signal is then RS decoded in block 214 and code block de-segmented 215 and then CRC checked in block 216 to generate received decoded data 204. Similar to transmitter 202, turbo decoder 212 may be a hardware turbo accelerator in an LTE base station or RU, while the symbol de-interleaver 213 and RS decoder 214 may be performed by software on a DSP, for example. In one embodiment, a single DSP core may be dedicated to error correction processing to minimize data transfer among components in the receiver.

The parameters used for the turbo+RS concatenated code may be selected to facilitate reuse of the hardware turbo modules in an LTE base station, for example. LTE turbo code with code rate matching may be used to provide various code rates in a Modulation and Coding Scheme (MCS) table. The output block size of RS codes from RS encoder 206 should match the input block size of turbo codes in turbo encoder 208. The RS code may be specified by three parameters (N,K,t), where N is the output block size (in symbols), K is the input block size in symbols, and t is the number of symbol errors that can be corrected. The three parameters are related; K=N−2t. To simplify software implementations of the RS encoder/decoder, RS over the field GF($2^8$) may be used so that the code symbols correspond to whole bytes.

The RS encoder may use one of many shortened RS codes that are all derived from a single mother code, e.g., RS(255, 255-2t) where t is the error correction capability in bytes of the RS code (e.g., t=4). Typically a shortened RS code is used which has a form RS(255-S, 255-2t-S). For example, RS(192, 184) and RS(128, 122). In addition, for certain resource allocation sizes, an RS code shortening technique may be used to provide an additional rate matching scheme on top of the Turbo code block rate matching. The outer RS code may correct residual bit errors at the output of Turbo decoder, and thereby improve the link performance, as compared to a conventional FEC scheme using only Turbo code, by pushing down the potential error floor in the block error ratio (BLER) performance curve. Concatenating RS code to turbo code allows very low BLER, such as at a BLER=$10^{-6}$ or less.

Referring again to FIG. 2, CRC block 205, the input data block to the RS encoder is appended with CRC parity bits for error detection at the receiver. In one embodiment, a CRC accelerator on a bit rate coprocessor (BCP) for CRC encoder/decoder may be used. The length of the CRC parity bits may depend on the size of the turbo block size.

However, in the embodiment described in more detail below, a 24-bit CRC may be used for all block sizes, for example.

The generator polynomials from the LTE standard may be used for the different size CRC generation, such as:

$$g_{crc24A} = D^{24} + D^{23} + D^{18} + D^{17} + D^{14} + D^{11} + D^{10} + D^7 D^6 D^5 D^4 D^3 + D + 1, \text{ or}$$

$$g_{crc24B} = D^{24} D^{23} D^6 + D^5 + D + 1$$

Referring again to FIG. 2, the encoding and decoding may be done similar to LTE to enable the reuse of the hardware accelerator, for example. After adding 205 the CRC parity bits, the input block size is segmented 206 into RS blocks. The number of RS blocks depends on the turbo block size and the number of turbo blocks. For example, with three turbo blocks of size 6144, then there may be a total of 12 RS (192,184,4) blocks; or with one turbo block of size 1024, then there may be one RS (128,122,3) block.

Interleaver 208 maps the output of RS blocks to the input of turbo blocks. The objective of the interleaver is to spread any possible error from the turbo decoder among as many RS blocks as possible to maximize the correcting probability. The RS output is in symbols (i.e., 8 bits); while the unit in the turbo block is a bit.

Figure 3:
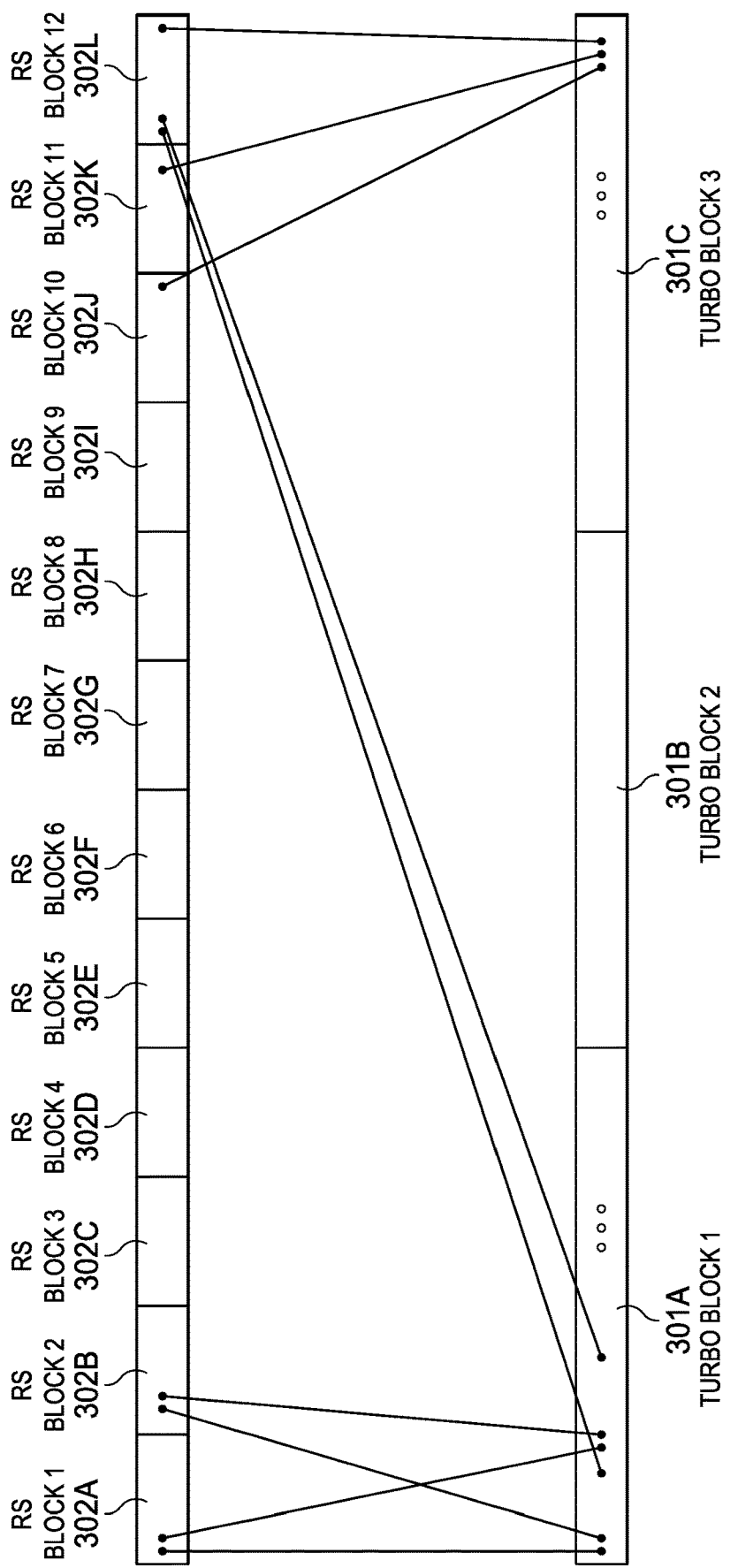
FIG. 3 is an illustration of turbo block interleaving.

FIG. 3 illustrates the interleaver operation in an example embodiment with a turbo block size 6144 and three turbo blocks 301A-C. In this example, there are a total of 12 RS blocks (192,184,4) 302A-L. The turbo blocks 301A-C are filled sequentially by symbols from successive RS blocks 302A-L. For example, the first 8 bits in the first turbo block 301A are from the first symbol (i.e., 8 bits) of the first RS block 302A, the second 8 bits of the first turbo block 301A are the first output symbol from the second RS block 302B, and the $12^{th}$ set of 8 bits in the first turbo block 301A are the first output symbol in the $12^{th}$ RS block 302L, and so on as shown in FIG. 3. The whole eight bits of each RS symbol are sequentially placed in the corresponding locations in the turbo block.

In another embodiment, the interleaving may be constrained to just a single turbo block, for example. In that case, turbo block 301A may receive output symbols from RS blocks 302A-302D, turbo block 301B may receive output symbols from RS blocks 302E-302H, etc. Restricting interleaving in this manner may reduce latency at the receiver, for example.

FEC Code Block Segmentation and Configuration Details

Typically, after the CRC bits are added, one transport block may be segmented into two or more FEC blocks before they are FEC-encoded and symbol-mapped (e.g., with a QAM mapper) and transmitted on the resources (frequency and time resource) available in one transmission time interval (TTI). The TTI typically may be one slot or one subframe, e.g., 0.5 ms or 1 ms in the example LTE system.

LTE systems use a quadrature amplitude modulation (QAM) scheme for the PDSCH and it may therefore be convenient to use QAM for the wireless backhaul links. QAM conveys two analog message signals, or two digital bit streams, by changing (modulating) the amplitudes of two carrier waves, using an amplitude-shift keying (ASK) digital modulation scheme or an amplitude modulation (AM) analog modulation scheme. The two carrier waves, usually sinusoids, are out of phase with each other by 90° and are thus called quadrature carriers or quadrature components—hence the name of the scheme. The modulated waves are summed, and the final waveform is a combination of both phase-shift keying (PSK) and amplitude-shift keying (ASK).

In LTE, ten 1 ms subframes compose a 10 ms frame. Each subframe divides into two slots. The smallest modulation structure in LTE is the Resource Element (RE). A Resource Element is one 15 kHz subcarrier by one symbol. Resource Elements are aggregated into Resource Blocks. A Resource Block has dimensions of subcarriers by symbols. Twelve consecutive subcarriers in the frequency domain and six or seven symbols in the time domain form each Resource Block. The total number of resource elements that may be allocated in a backhaul channel may depend on the bandwidth of the channel. In a typical communication channel, there may be thousands of RE available at any given moment in time that may be allocated among more than one user of the channel.

A high degree of flexibility is desirable for the various possible resource allocation sizes, various modulation orders, and various target spectral efficiencies for a given resource allocation size. Likewise, it may be desirable to maintain a low order of complexity for determining MCS parameters for each transport block of data. Likewise, it may be desirable to support Turbo code configurations that are already supported by commercially available devices for 3G, LTE, WiMax, etc., for example.

As will be described in more detail below, in order to reduce complexity, a single mother code for outer RS coding may be employed, e.g., RS(255,247). Multiple FEC blocks (Turbo+RS) for a single transport block may be configured to have approximately equal error-correction capabilities. In this way, the overall transport block error rate may be minimized in an efficient manner. In particular, flexible FEC segmentation and configuration is achieved by carefully employing RS code shortening on top of turbo code rate matching.

Table 1 summarizes the parameter definitions and terminology that will be used in the following disclosure.

TABLE 1

Parameter Definitions

| Symbol | Definition |
|---|---|
| nRE | Resource allocation size for one TTI [in number of REs (RE: resource element)] |
| modOrder | Modulation order in bits per QAM symbol |
| TBS, tbs | Transport block size [bits]. It is assumed that tbs is selected such that it leads to one of valid turbo block sizes after FEC code block segmentation procedure. |
| k_tb | Transport block with CRC bits added, tbs + 24 [bits] |
| nFEC | Number of FEC blocks in a transport block |
| K_fec | Input FEC block size [Bytes] |
| nRS | Number of RS blocks in a FEC block |
| K_rs | Nominal input RS block size [Bytes] |
| N_rs | Nominal output (coded) RS block size [Bytes] |
| nRS_adj | Number of RS blocks that should be encoded with RS(N_rs + 1, K_rs + 1): First nRS_adj RS blocks in each FEC block are encoded with RS(N_rs + 1, K_rs + 1), and the remainder (nRS − nRS adj) RS blocks are encoded with RS(N_rs, K_rs) |
| N_rs_fec | FEC block size after RS encoding and concatenation [Bytes] |
| k_tc | Input Turbo code block size [bits] |
| k_tc_set | Set of all the possible Turbo input block sizes |
| n_tc | Nominal output Turbo code block size [bits] |
| nTC_adj | Number of Turbo code blocks that should be encoded with TC(n_tc + 1, k_tc): First nTC_adj Turbo blocks in a transport block are encoded with TC(n_tc + 1, k_tc), and the remainder (nFEC − nTC_adj) Turbo blocks are encoded with TC(n_tc, k_tc) |
| n_tb | Output (encoded) transport block size after Turbo encoding and concatenation [bits] |
| rs · T | Error correction capability of the mother RS code [in Byte] |
| rs · N | Encoded output block size of the mother RS code [in Byte] |
| rs · K | Input block size of the mother RS code [in Byte] |
| rs · P | Parity size of the mother RS code [in Byte] |
| efficiency | Spectral efficiency, k_tb/nRE [bits/Hz] |

Table 2 provides an example of a sixteen entry (MCS index) MCS table for a particular resource allocation size of 4896 REs. Each row of the table defines a specific MCS for a given transport block size (TBS). This table includes sixteen potential transport block sizes ranging from 2408 bits to 35816 bits, as denoted in the third column. The second column refers to the modulation order: 2 for QPSK, 4 for 16QAM, 6 for 64QAM, and 8 for 256QAM transmissions.

As will now be described in more detail, the number and size of each RS block and the number and size of each turbo block that will be used to transmit the TB may be simply calculated rather than storing a large number of MCS tables for the range of REs that can be accessed using the MCS index corresponding to the TBS for a given number of REs to provide this information.

Figure 4:
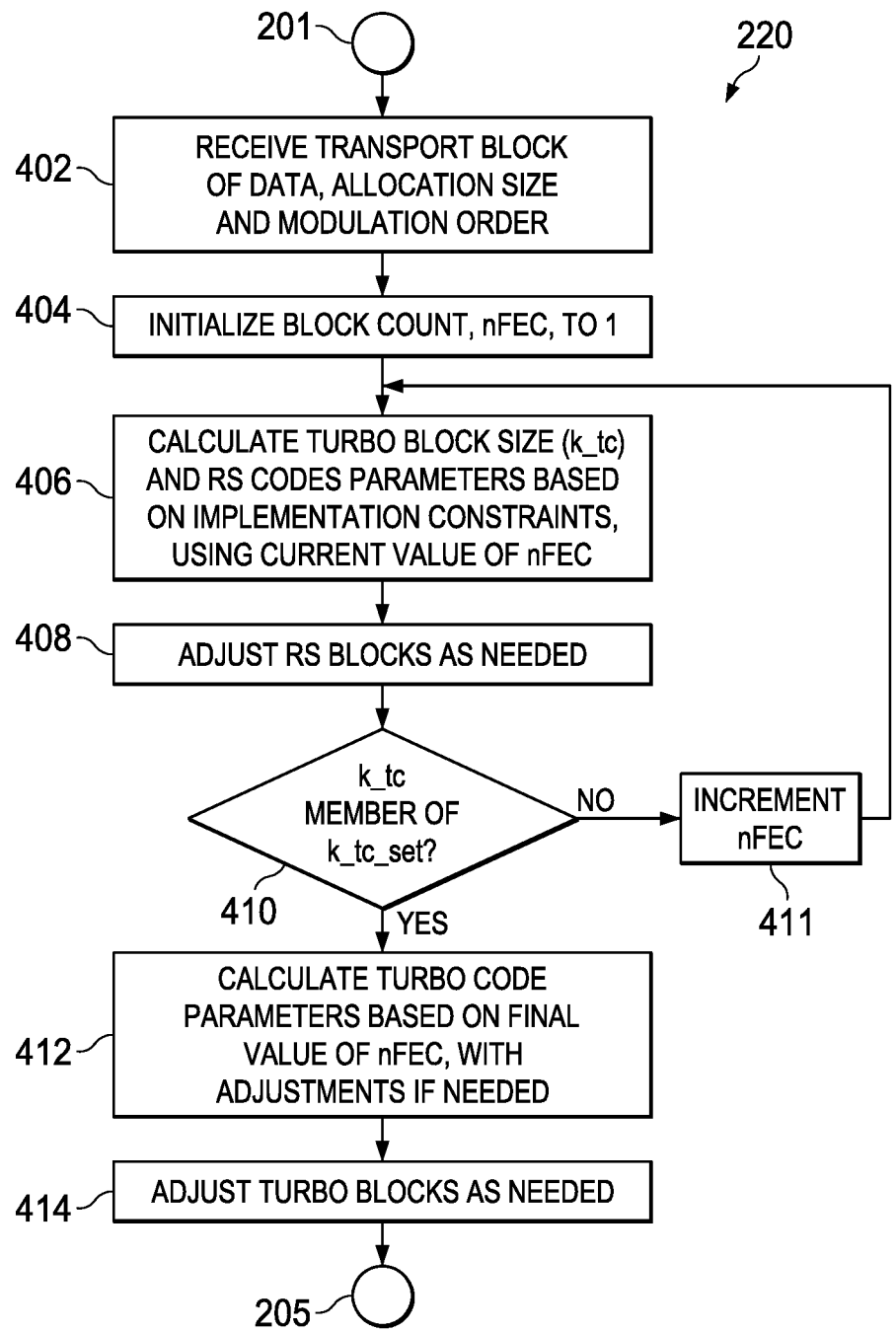
FIGS. 4 and 5 are flow charts illustrating methods for calculating a modulation coding scheme.

FIG. 4 is a flow chart illustrating a method for calculating a modulation coding scheme (MCS) to perform function

TABLE 2

FEC segmentation and configuration as part of MCS table (for resource allocation size of 4896 REs)

| MCS index | Modu- lation | TBS | k_tb | nFEC | K_fec | nRS | K_rs | N_rs | nRS_adj | N_rs_fec | k_tc | n_tc | nTC_adj | n_tb | efficiency |
|---|---|---|---|---|---|---|---|---|---|---|---|---|---|---|---|
| 0 | 2 | 2408 | 2432 | 1 | 304 | 2 | 152 | 160 | 0 | 320 | 2560 | 9792 | 0 | 9792 | 0.4967 |
| 1 | 2 | 3560 | 3584 | 1 | 448 | 3 | 149 | 157 | 1 | 472 | 3776 | 9792 | 0 | 9792 | 0.7320 |
| 2 | 2 | 4776 | 4800 | 1 | 600 | 4 | 150 | 158 | 0 | 632 | 5056 | 9792 | 0 | 9792 | 0.9804 |
| 3 | 2 | 5992 | 6016 | 2 | 376 | 3 | 125 | 133 | 1 | 400 | 3200 | 4896 | 0 | 9792 | 1.2288 |
| 4 | 4 | 7784 | 7808 | 2 | 488 | 3 | 162 | 170 | 2 | 512 | 4096 | 9792 | 0 | 19584 | 1.5948 |
| 5 | 4 | 9832 | 9856 | 2 | 616 | 4 | 154 | 162 | 0 | 648 | 5184 | 9792 | 0 | 19584 | 2.0131 |
| 6 | 4 | 11112 | 11136 | 2 | 696 | 4 | 174 | 182 | 0 | 728 | 5824 | 9792 | 0 | 19584 | 2.2745 |
| 7 | 4 | 13608 | 13632 | 3 | 568 | 4 | 142 | 150 | 0 | 600 | 4800 | 6528 | 0 | 19584 | 2.7843 |
| 8 | 6 | 15912 | 15936 | 3 | 664 | 4 | 166 | 174 | 0 | 696 | 5568 | 9792 | 0 | 29376 | 3.2549 |
| 9 | 6 | 18408 | 18432 | 4 | 576 | 4 | 144 | 152 | 0 | 608 | 4864 | 7344 | 0 | 29376 | 3.7647 |
| 10 | 6 | 20712 | 20736 | 4 | 648 | 4 | 162 | 170 | 0 | 680 | 5440 | 7344 | 0 | 29376 | 4.2353 |
| 11 | 6 | 23656 | 23680 | 5 | 592 | 4 | 148 | 156 | 0 | 624 | 4992 | 5875 | 1 | 29376 | 4.8366 |
| 12 | 8 | 26856 | 26880 | 5 | 672 | 4 | 168 | 176 | 0 | 704 | 5632 | 7833 | 3 | 39168 | 5.4902 |
| 13 | 8 | 29928 | 29952 | 6 | 624 | 4 | 156 | 164 | 0 | 656 | 5248 | 6528 | 0 | 39168 | 6.1176 |
| 14 | 8 | 33000 | 33024 | 6 | 688 | 4 | 172 | 180 | 0 | 720 | 5760 | 6528 | 0 | 39168 | 6.7451 |
| 15 | 8 | 35816 | 35840 | 7 | 640 | 4 | 160 | 168 | 0 | 672 | 5376 | 5595 | 3 | 39168 | 7.3203 |

Notice in Table 2 the k_tc column specifies the input block size of the turbo code to be used for each MCS to accommodate the various sizes of transport blocks. An example embodiment of a communication infrastructure device for 3G and LTE may support the set of possible turbo codes (k_tc_set) listed in Table 2, for example. In this example, the defined set of k_tc is an implementation constraint that must be accommodated by the calculated MCS.

220, referring back to FIG. 2. Table 4 provides pseudo code for determining a MCS for a particular transport block based on just the transport block size (TBS), the assigned modulation order (modOrder) and the allocated number of REs (nRE) for that transport block. TBS, nRE, and modOrder may be provided by a higher level of control software in an LTE system, for example that determines the size of the transport block. In Table 4, "%" indicates a comment follows.

TABLE 3 k_tc_set for an example communication device for 3G and LTE k_tc_set = {40, 48, 56, 64, 72, 80, 88, 96, 104, 112, 120, 128, 136, 144, 152, 160, 168, 176, 184, 192, 200, 208, 216, 224, 232, 240, 248, 256, 264, 272, 280, 288, 296, 304, 312, 320, 328, 336, 344, 352, 360, 368, 376, 384, 392, 400, 408, 416, 424, 432, 440, 448, 456, 464, 472, 480, 488, 496, 504, 512, 528, 544, 560, 576, 592, 608, 624, 640, 656, 672, 688, 704, 720, 736, 752, 768, 784, 800, 816, 832, 848, 864, 880, 896, 912, 928, 944, 960, 976, 992, 1008, 1024, 1056, 1088, 1120, 1152, 1184, 1216, 1248, 1280, 1312, 1344, 1376, 1408, 1440, 1472, 1504, 1536, 1568, 1600, 1632, 1664, 1696, 1728, 1760, 1792, 1824, 1856, 1888, 1920, 1952, 1984, 2016, 2048, 2112, 2176, 2240, 2304, 2368, 2432, 2496, 2560, 2624, 2688, 2752, 2816, 2880, 2944, 3008, 3072, 3136, 3200, 3264, 3328, 3392, 3456, 3520, 3584, 3648, 3712, 3776, 3840, 3904, 3968, 4032, 4096, 4160, 4224, 4288, 4352, 4416, 4480, 4544, 4608, 4672, 4736, 4800, 4864, 4928, 4992, 5056, 5120, 5184, 5248, 5312, 5376, 5440, 5504, 5568, 5632, 5696, 5760, 5824, 5888, 5952, 6016, 6080, 6144}

It can be seen after considering Table 2 and Table 3 that it would take a large amount of storage to store multiple MCS tables that could cover a wide range of RE allocations and TBSs. Embodiments of the disclosure may include a function that may calculate MCS parameters for a particular transport block (TB) based on the following parameters that define the overall code rate: TBS, a scheduled allocation size for the TB (nRE), and the modulation order to be used for the TB (modOrder). The overall code rate (OCR) for the transport block is defined by equation (1).

$$OCR = (tbs + CRC)/(nRE * modOrder) \quad (1)$$

As described above, the TBS may be large enough so that it cannot be encoded even with the largest turbo block. In that case, the TB should be segmented into multiple FEC blocks. Each of the FEC blocks may be encoded with RS encoder using its RS implementation constraints and also with turbo encoder with its turbo implementation constraints, including k_tc should be in k_tc_set. It is therefore necessary to determine what input turbo code block size (k_tc) can be used to segment the transport block into a number of FEC blocks (nFEC) in order to prepare the current transport block of data for transmission. The size of the FEC block(s) then may be used to calculate the RS block parameters.

In this embodiment, a set of parameters is predefined and used for all transport blocks. In this example, the following set of parameters is defined: rs·T=4, rs·P=2*rs·T; rs·N=192; and rs·K=rs·N−rs·P, as shown in Table 4. These parameters define a common RS code having the form of (192, 184). In another embodiment, different RS parameters may be selected than those disclosed herein. Furthermore, in some embodiments, the set of parameters may be dynamic, in that different sets may be chosen for different size transport blocks, for example.

In this example, a 24 bit CRC is added to all transport blocks, regardless of size, such that k_tb=tbs+24, as indicated in Table 4. However, as mentioned above, in other embodiments the size of the CRC field may be different for different size transport blocks, for example.

In this example, since the number of FEC blocks is not known when the transport block is received 402, an iterative approach is used in which an initial set of RS code parameters is calculated 406 after initializing 404 nFEC=1. In Table 4, the pseudo code labeled "% calculate RS codes parameters" illustrates how a number of RS blocks (nRS) may be determined by dividing the transport block size with CRC bits (k_tb) by the current nFEC and by eight bits per byte and using a ceil (x) function. In this example, ceil (X) rounds the elements of X to the nearest integers towards infinity, and floor (X) rounds the elements of X to the nearest integers towards minus infinity. A nominal input RS block size (N_rs) may be determined by using the floor (X) function as shown in Table 4.

An adjustment 408 may then be performed to increase (or reduce) the size of one or more RS blocks in order to provide rate matching without adding padding bits. The number of RS blocks that need adjustments (nRS_adj) may be calculated by subtracting K_rs*nRS from K_fec, as shown in Table 4. The first nRS_adj RS blocks in each FEC block are encoded with RS(N_rs+1, K_rs+1), and the remaining (nRS−nRS_adj) RS blocks are encoded with RS(N_rs, K_rs).

A FEC block size after RS encoding and concatenation (in bytes) (N_rs_fec) is then calculated by adding K_fec to rs·P*nRS, as shown in Table 4. A total input turbo code block size (k_tc) in bits is then calculated by multiplying N_rs_fec by eight.

k_tc is then compared 410 to the set of all allowable k_tc to determine if the calculated k_tc is a member of the set. As mentioned above, Table 3 includes an example set of allowable k_tc for an example type of 3G and LTE communication device. If not, then nFEC is incremented 411 and the process of calculating 406, 408 the RS parameters is repeated until a match is found.

Once a k_tc match is found, the turbo code parameters may be calculated 412 using the code illustrated in Table 4 in the section labeled "% calculate Turbo code parameters". The output (encoded) transport block size after Turbo encoding and concatenation [in bites] may be calculated by multiplying nRE by the modulation order (modOrder) parameter that was provided along with the transport block of data. The nominal output Turbo code block size [in bits] may then be calculated using the floor(x) function on the result of n_tb/nFEC, as shown in Table 4.

An adjustment 414 may then be made to increase (reduce) the size of one or more FEC blocks in order to provide rate matching without adding padding bits. The number of Turbo blocks that need adjustments (nTC_adj) is calculated by subtracting n_tc*nFEC from n_tb, as shown in Table 4. The first nTC_adj Turbo blocks in a transport block are encoded with TC(n_tc+1, k_tc), and the remaining (nFEC−nTC_adj) Turbo blocks are encoded with TC(n_tc, k_tc).

After calculating the modulation and coding scheme for the current transport block, the transport block may then be passed to the RS encoder 207 for RS encoding, referring again to FIG. 2, and then to symbol interleaver 208 and to turbo encoder 209.

When the encoded transport block is transmitted to receiver 203, the calculated MCS parameters may be forwarded along with the data so that decoder function within the receiver knows how the transport block is organized. Alternatively, the receiver may perform calculations 222 similar to those described above in order to determine how the transport block is organized.

TABLE 4 pseudo code for MCS determination based on TBS

```
For a given set of inputs: tbs, modOrder, nRE
% parameters for mother RS code
rs.T        = 4;
rs.P        = 2*rs.T;
rs.N        = 192;
rs.K        = rs.N − rs.P;
% transport block size with CRC added
k_tb        = tbs + 24;
% initialize variables
nFEC        = 0;
flagValid   = 0;
while flagValid==0
    nFEC        = nFEC + 1;
    % calculate RS codes parameters
    K_fec       = k_tb/nFEC/8;
    nRS         = ceil(K_fec/rs.K);
    K_rs        = floor(K_fec/nRS);
    N_rs        = K_rs + rs.P;
    nRS_adj     = K_fec − K_rs*nRS;
    N_rs_fec    = K_fec + rs.P*nRS;
    k_tc        = 8*N_rs_fec;
    % check if k_tc is valid
    if k_tc is a member of k_tc_set
        flagValid = 1;
    end
end
% calculate Turbo code parameters
n_tb        = nRE*modOrder;
n_tc        = floor(n_tb/nFEC);
nTC_adj     = n_tb − n_tc*nFEC;
```

Figure 5:
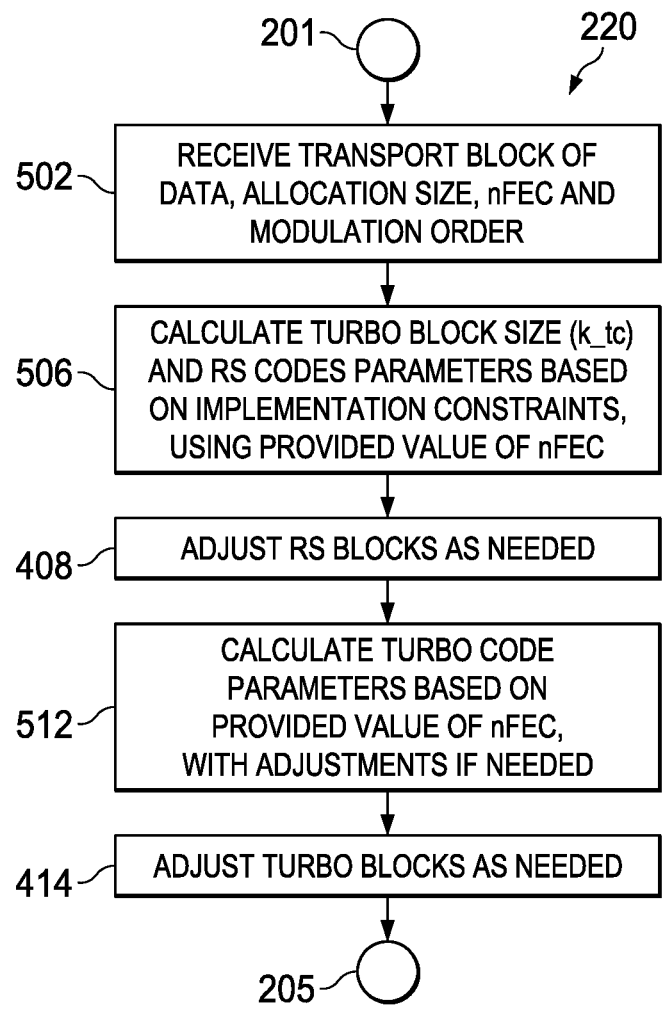

FIG. 5 is a flow chart illustrating another method for calculating a modulation coding scheme (MCS) to perform function 220, referring back to FIG. 2. In this embodiment, the number of FEC blocks (nFEC) may also be provided 502 by the high level control software along with the input transport block and the TBS, nRE, and modOrder parameters. In this case, the FEC segmentation and parameters may be generated with lower complexity but at a cost of an additional memory requirement for keeping the number of FEC blocks information for each MCS index. Pseudo code for this method is provided in Table 5. Notice that the computations for the RS codes parameters 506 and turbo code parameters 512 are the same as described with regard to FIG. 4, except that the value on nFEC is provided by a higher level control function. Thus, in this case, the iterative loop for determining nFEC is no longer needed.

TABLE 5 pseudo code for MCS
determination based on TBS when nFEC is given

For a given set of inputs: tbs, nFEC, modOrder, nRE,
% parameters for mother RS code
```
rs.T       = 4;
rs.P       = 2*rs.T;
rs.N       = 192;
rs.K       = rs.N - rs.P;
% transport block size with CRC added
k_tb       = tbs + 24;
% calculate RS codes parameters
K_fec      = k_tb/nFEC/8;
nRS        = ceil(K_fec/rs.K);
K_rs       = floor(K_fec/nRS);
N_rs       = K_rs + rs.P;
nRS_adj    = K_fec - K_rs*nRS;
N_rs_fec   = K_fec + rs.P*nRS;
k_tc       = 8*N_rs_fec;
% calculate Turbo code parameters
n_tb       = nRE*modOrder;
n_tc       = floor(n_tb/nFEC);
nTC_adj    = n_tb - n_tc*nFEC;
```

Table 6 provides pseudo code for an optional scheme for calculating the turbo code parameters that may be applied to either scheme illustrated by FIG. 4 or 5, for example. In this example, the variable nq_tc is a nominal output turbo block size in number of QAM symbols. In this example, the definition of nTC-adj is changed slightly from what is given in Table 1, as follows: the first nTC_adj Turbo blocks in a transport block are encoded with TC(n_tc+modOrder, k_tc), and the remainder (nFEC−nTC_adj) Turbo blocks are encoded with TC(n_tc, k_tc), where modOrder is the number of bits per QAM symbol. In this manner, the output of the turbo blocks may be made to align with QAM symbol boundaries during the modulation stage, which may allow for easier implementation.

TABLE 6

Alternate scheme for calculating Turbo Code parameters

```
% Turbo code parameters
n_tb       = nRE*modOrder;
nq_tc      = floor(nRE/nFEC);
```

TABLE 6-continued

Alternate scheme for calculating Turbo Code parameters

```
n_tc       = nq_tc*modOrder;
nTC_adj    = nRE - nq_tc*nFEC;
```

In the example of Table 6, once a k_tc match is found as shown in Table 4 or Table 5, the turbo code parameters may be calculated using the code illustrated in Table 6. The output (encoded) transport block size after Turbo encoding and concatenation [in bits] (n_tb) may be calculated by multiplying nRE by the modulation order (modOrder) parameter that was provided along with the transport block of data. The nominal output Turbo code block size in number of QAM symbols (nq_tc) may then be calculated using the floor(x) function on the result of nRE/nFEC, as shown in Table 6. The nominal output Turbo code block size in bits (n_tc) may then be determined by multiplying nq_tc by the modulation order, as shown in Table 6.

An adjustment may then be made to increase (reduce) the size of one or more FEC blocks in order to provide rate matching without adding padding bits. The number of Turbo blocks that need adjustments (nTC_adj) may be calculated by subtracting nq_tc*nFEC from nRE, as shown in Table 6. The first nTC_adj Turbo blocks in a transport block are encoded with TC(n_tc+modOrder, k_tc), and the remainder (nFEC−nTC_adj) Turbo blocks are encoded with TC(n_tc, k_tc).

As mentioned above, higher level control software is responsible for determining the transport block size to be compatible with the overall MCS structure in which the detailed parameters may be computed as described above. A TBS size for each MCS index for a given allocation size may be determined offline as part of the air interface design to be compatible with the overall FEC structure and constraints and meet the target spectral efficiency, for example. Table 6 provides a portion of transport block size table that covers nRE from 150 up to 432, with each resource allocation size (nRE) having sixteen MCS indices. While eleven columns corresponding to eleven different nRE allocations are illustrated in Table 6, in a typical LTE system, there may be as many as one hundred or more possible allocation combinations for nRE allocations up to 9600, for example. Thus, the calculation scheme disclosed herein may replace the need for storing nearly one hundred MCS tables such the MCS table illustrated in Table 2 with a much simpler transport block size table as partially illustrated in Table 7.

TABLE 7

Transport Block Size table example

| MCS Index | nRE | | | | | | | | | | |
|---|---|---|---|---|---|---|---|---|---|---|---|
| | 150 | 216 | 240 | 252 | 288 | 300 | 324 | 360 | 372 | 396 | 432 |
| 0 | 88 | 136 | 152 | 160 | 184 | 192 | 216 | 240 | 248 | 264 | 296 |
| 1 | 120 | 192 | 208 | 224 | 256 | 272 | 296 | 328 | 344 | 368 | 400 |
| 2 | 160 | 240 | 272 | 288 | 328 | 344 | 376 | 416 | 424 | 456 | 504 |
| 3 | 216 | 320 | 360 | 376 | 424 | 456 | 488 | 552 | 568 | 600 | 664 |
| 4 | 280 | 408 | 456 | 472 | 552 | 568 | 616 | 696 | 712 | 760 | 840 |
| 5 | 320 | 456 | 520 | 552 | 632 | 648 | 712 | 792 | 824 | 872 | 968 |
| 6 | 392 | 568 | 632 | 664 | 776 | 808 | 872 | 968 | 1000 | 1064 | 1160 |
| 7 | 456 | 680 | 760 | 792 | 904 | 936 | 1032 | 1128 | 1192 | 1256 | 1384 |
| 8 | 536 | 792 | 872 | 920 | 1064 | 1096 | 1192 | 1320 | 1384 | 1480 | 1608 |
| 9 | 616 | 888 | 1000 | 1032 | 1192 | 1256 | 1352 | 1512 | 1544 | 1672 | 1800 |
| 10 | 696 | 1032 | 1128 | 1192 | 1384 | 1416 | 1544 | 1736 | 1768 | 1896 | 2088 |
| 11 | 744 | 1096 | 1224 | 1288 | 1448 | 1512 | 1640 | 1832 | 1896 | 2024 | 2216 |
| 12 | 840 | 1224 | 1352 | 1416 | 1640 | 1704 | 1832 | 2024 | 2088 | 2280 | 2472 |
| 13 | 904 | 1320 | 1480 | 1544 | 1768 | 1864 | 2024 | 2216 | 2280 | 2472 | 2664 |

TABLE 7-continued

Transport Block Size table example

| MCS Index | nRE | | | | | | | | | |
|---|---|---|---|---|---|---|---|---|---|---|
| | 150 | 216 | 240 | 252 | 288 | 300 | 324 | 360 | 372 | 396 | 432 |
| 14 | 1000 | 1448 | 1608 | 1672 | 1896 | 2024 | 2152 | 2408 | 2472 | 2664 | 2920 |
| 15 | 1064 | 1576 | 1736 | 1832 | 2088 | 2152 | 2344 | 2600 | 2728 | 2920 | 3176 |

Figure 6:
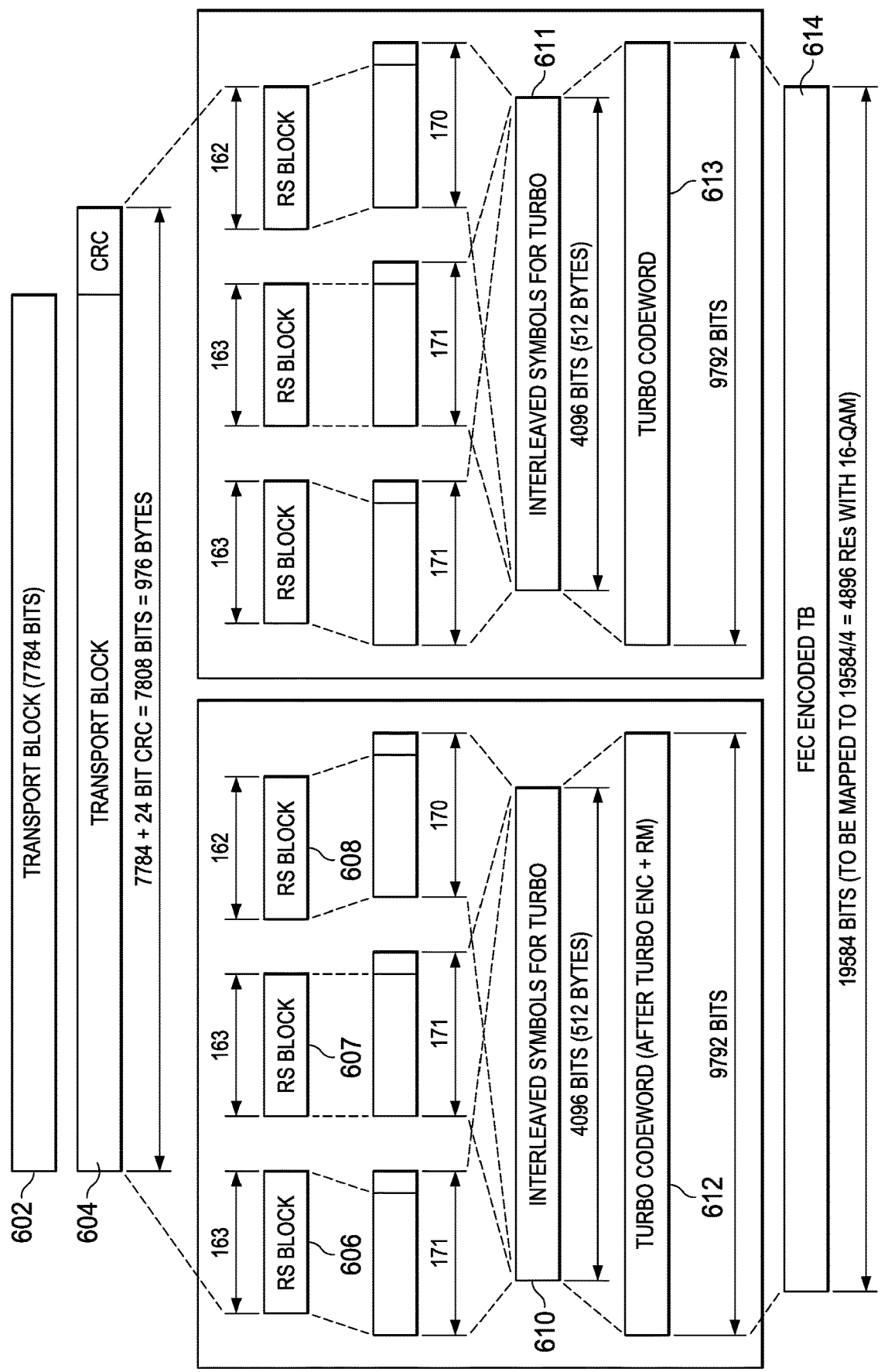
FIG. 6 is a schematic that illustrates a particular FEC segmentation and configuration.

FIG. 6 is a schematic that illustrates a particular FEC segmentation and configuration for MCS index 4 of MCS table shown in Table 2 using 4896 REs with 16-QAM. In this example, the higher level control software would provide the transmitter with a transport block 602 having a TBS of 7784 bits. After adding a 24 bit CRC, k_tb=7808 bits, which is 976 bytes, as illustrated at 604.

After one iteration of calculating RS code parameters 406, 408, referring again to FIG. 4, a determination may be made that nFEC=2 for this transport block. nRS is calculated to be three for each FEC block, as illustrated by RS blocks 606-608. K_rs is calculated to be 162 and N_rs is calculated to be 170. nRS_adj is calculated to be two, therefore RS blocks 606 and 607 are RS encoded with RS(N_rs+1, K_rs+1), and the remaining (nRS−nRS_adj) RS block 608 is encoded with RS(N_rs, K_rs).

The RS blocks are then interleaved to form turbo blocks 610, 611 that each have 4096 bits. After turbo encoding and rate matching, two code words 612, 613 are produced that each have 9792 bits. These two FEC blocks are then concatenated to form one 19584 bit FEC encoded transport block 614. TB 614 may then be sent to a mapper in transmitter 202, referring again go FIG. 2, for modulation using 16-QAM on 4896 REs.

Figure 7:
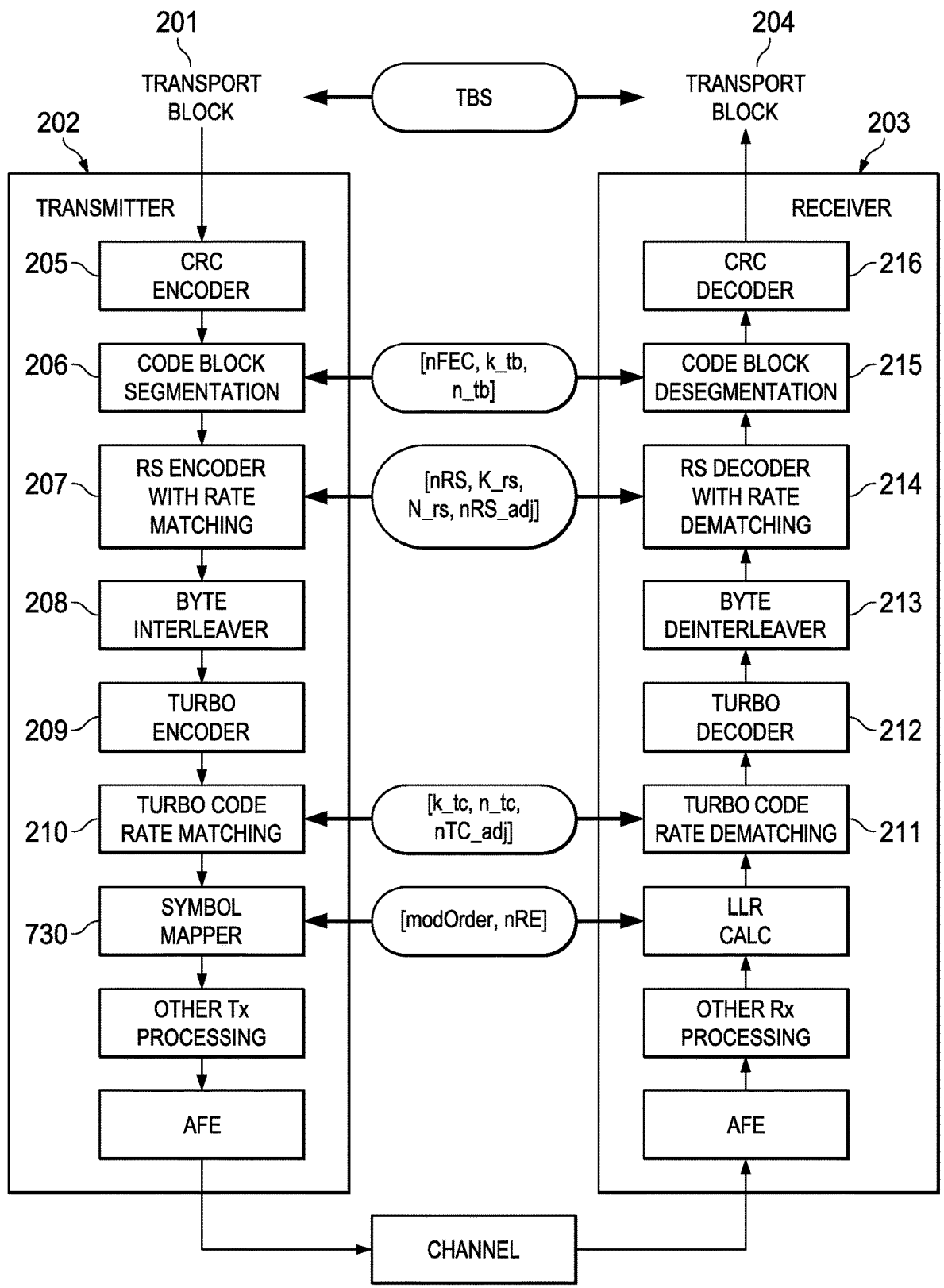
FIG. 7 is a more detailed block diagram of the transmitter and receiver of FIG. 2.

FIG. 7 is a more detailed block diagram of the transmitter and receiver of FIG. 2. This figure shows where each of MCS parameters are relevant/applied in the encoding and decoding chain. And it also illustrates an example overall signal chain including symbol mapper and AFE at Tx, and AFE, LLR calculation in Rx chain. Symbol mapper 730 performs symbol using known modulation techniques, such as QPSK, 16QAM, 64QAM, and 256QAM for an LTE system, for example.

System Examples

Figure 8:
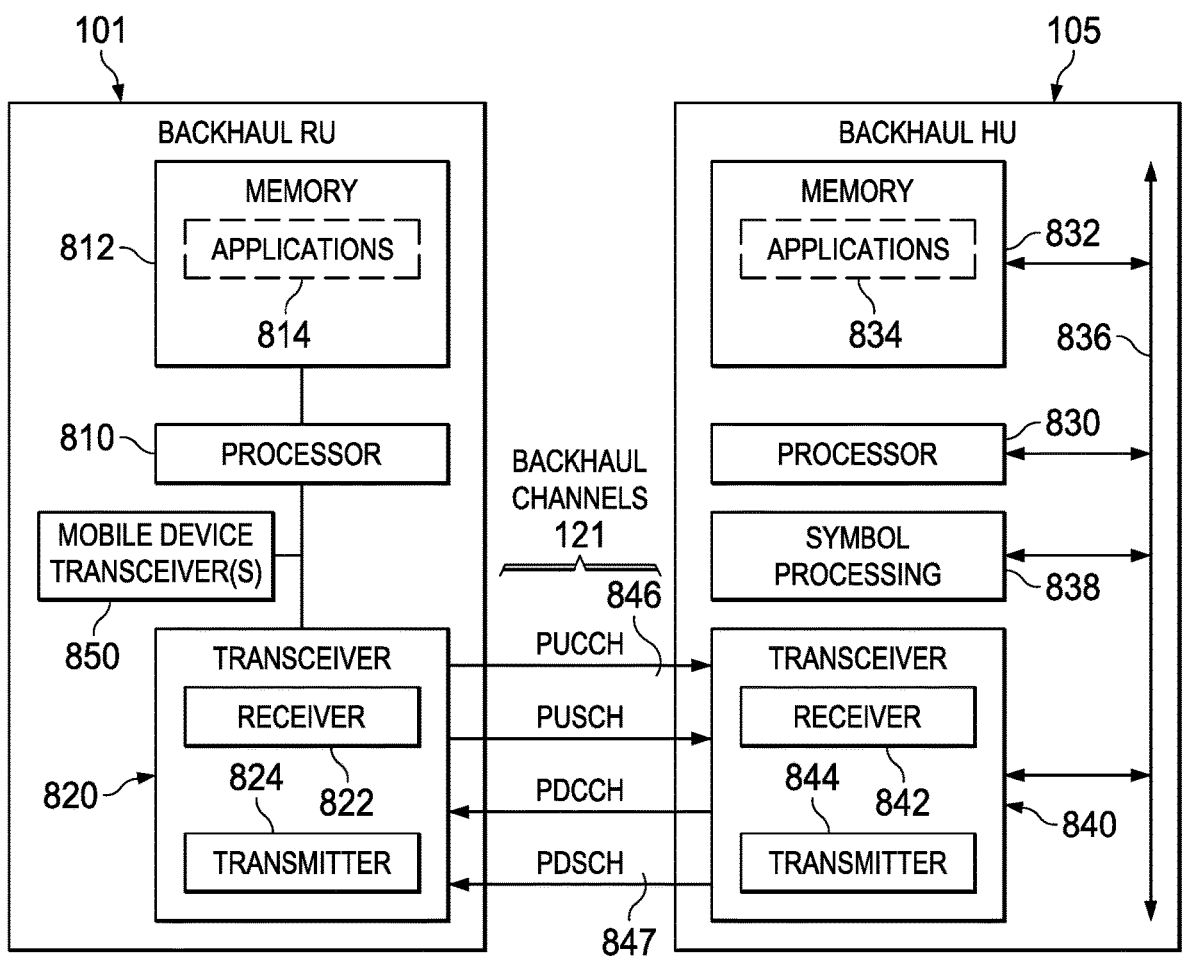
FIG. 8 is a more detailed block diagram of devices in the system of FIG. 1.

FIG. 8 is a more detailed block diagram illustrating operation of RU 101 and HU 105 in the network system of FIG. 1, for example. As shown, RU device 101 includes one or more processors 810 coupled to one or more memory blocks 812 and backhaul transceiver 820. Memory 812 stores (software) applications 814 for execution by processor 810. As an example, such applications may be categorized as operating systems (OS), device drivers, databases, communication protocols and layers, or other categories, for example. Regardless of the exact nature of the applications, at least some of the applications may direct RU device 101 to transmit to HU device 105 periodically or continuously via transceiver 820 on backhaul channels 846, 847, as described above in more detail.

Transceiver 820 includes uplink logic which may be implemented by execution of instructions that control the operation of the transceiver. Some of these instructions may be stored in memory 812 and executed when needed by processor 810. As would be understood by one of skill in the art, the components of the uplink Logic may involve the physical (PHY) layer and/or the Media Access Control (MAC) layer of the transceiver 820. Transceiver 820 includes one or more receivers 822 and one or more transmitters 824.

Transceiver 820 may be configured to transmit and receive one or more backhaul channels 846-847 using concatenated Turbo and RS coding as described in more detail above. RS coding parameters and Turbo coding parameters may be calculated on the fly by processor 810 as described above for each transport block. In this manner, a large number of MCS options may be provided without needing a large storage space in memory 812 for MCS tables.

A separate set of transceiver(s) 850 may be provided to communicate with various fixed or mobile devices in the vicinity, such as device 111, referring back to FIG. 1, on uplink and downlink channels, using known LTE protocols, for example. Data received from mobile devices via transceivers 850 may then be transmitted via backhaul channels 121 to HU 105, for example. Likewise, data received from BU 105 via backhaul channels 121 may be transmitted to mobile devices via transceivers 850.

HU device 105 may include one or more processors 830 coupled to one or more blocks of memory 832, symbol processing circuitry 838, and a transceiver 840 via backplane bus 836. The memory 832 stores applications 834 for execution by processor 830. The applications may comprise any known or future application useful for managing wireless communications. At least some of the applications 834 may direct the hub device to manage transmissions to or from RU device 101 using backhaul channels 846, 847, for example.

Transceiver 840 may include an uplink Resource Manager, which enables the HU device to selectively allocate backhaul channel resources to the various RU devices 101-104 in the vicinity of HU 105. As would be understood by one of skill in the art, the components of the uplink resource manager may involve the physical (PHY) layer and/or the Media Access Control (MAC) layer of the transceiver 840. Transceiver 840 includes a Receiver(s) 842 for receiving transmissions from various RU within range of the NodeB and transmitter(s) 844 for transmitting data and control information to the various RU within range of the NodeB. In some embodiments, HU 105 may also communicate directly with nearby UE in a similar manner as described for RU 101, for example.

The uplink resource manager executes instructions that control the operation of transceiver 840. Some of these instructions may be located in memory 832 and executed when needed on processor 830. The resource manager controls the transmission resources allocated to each RU and UE that is being served by HU device 105 and broadcasts control information via the physical downlink control channel PDCCH. In various embodiments, there may be multiple processors, hardware accelerators, and memory blocks to perform the operations described herein, for example.

Other Embodiments

While the disclosure has been described with reference to illustrative embodiments, this description is not intended to be construed in a limiting sense. Various other embodiments of the disclosure will be apparent to persons skilled in the art upon reference to this description. For example, although the detailed example described above is used in connection with an LTE system, it will be understood that embodiments may be used with systems complying with many types of wireless protocols and standards, such as 3G, LTE, WiMax, etc.

While this disclosure describes methods of generating FEC parameters as part of a MCS (modulation coding scheme) based on a TBS (transport block size) received as an input parameter for a communication system that employs a concatenated Turbo and RS coding scheme, the methods may be easily applied to other concatenated coding schemes in which an inner code such as turbo or convolutional is concatenated with an outer code such as RS or BCH, including, for example: concatenated convolutional code+RS coding, convolutional code+BCH coding, etc.

While example MCS tables having 16 entries for a given number of resource allocations were discussed, other embodiments may use a larger or smaller number of MCS options for a given number of resource allocations.

While use of a ceil(x) function was used to determine nRS, in another embodiment a floor(x) function may be used with corresponding changes in the nRS_adj calculation, for example. Similarly, a ceil(x) function may be used to determine N-rs. Other variations to the computation equations may be made in a similar manner, for example.

Figure 9A:
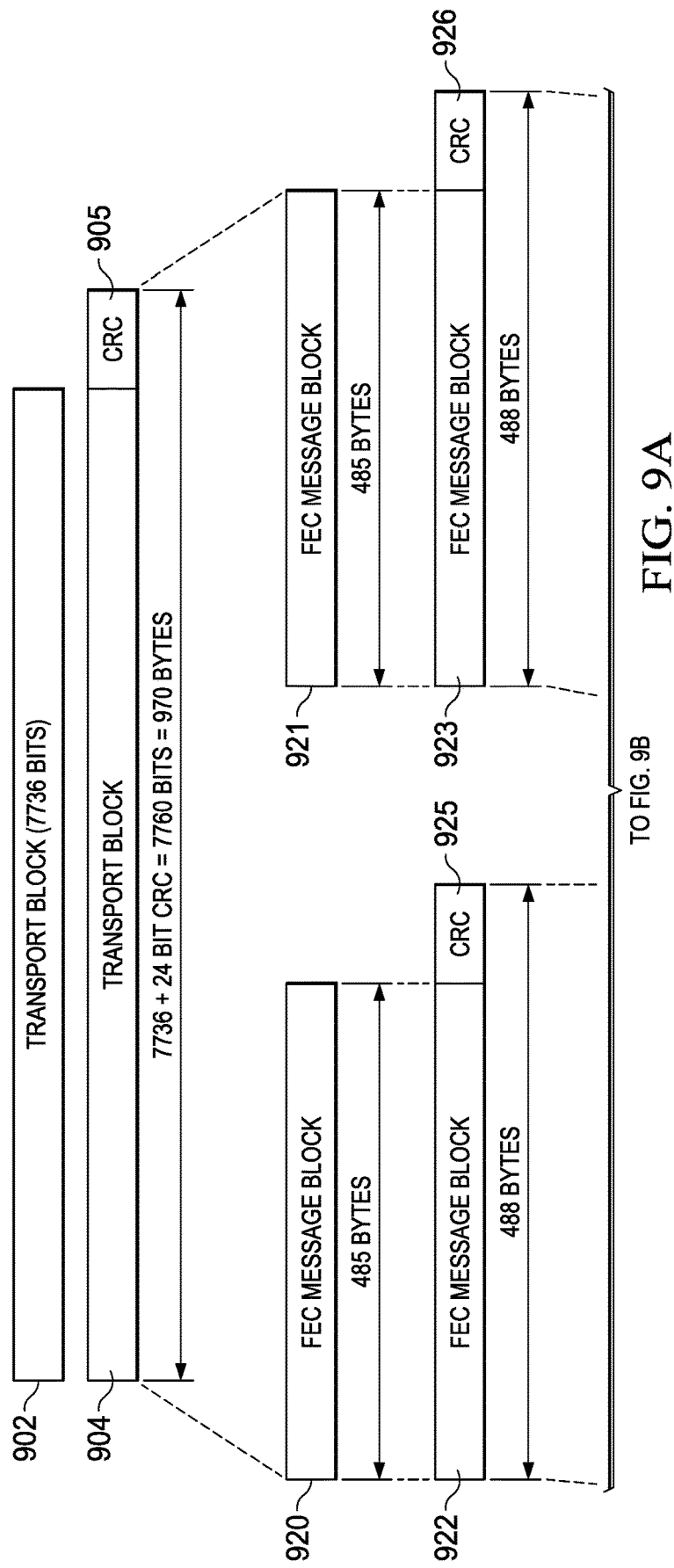
FIGS. 9A and 9B together are a schematic that illustrates another FEC segmentation and configuration arrangement.
Figure 9B:
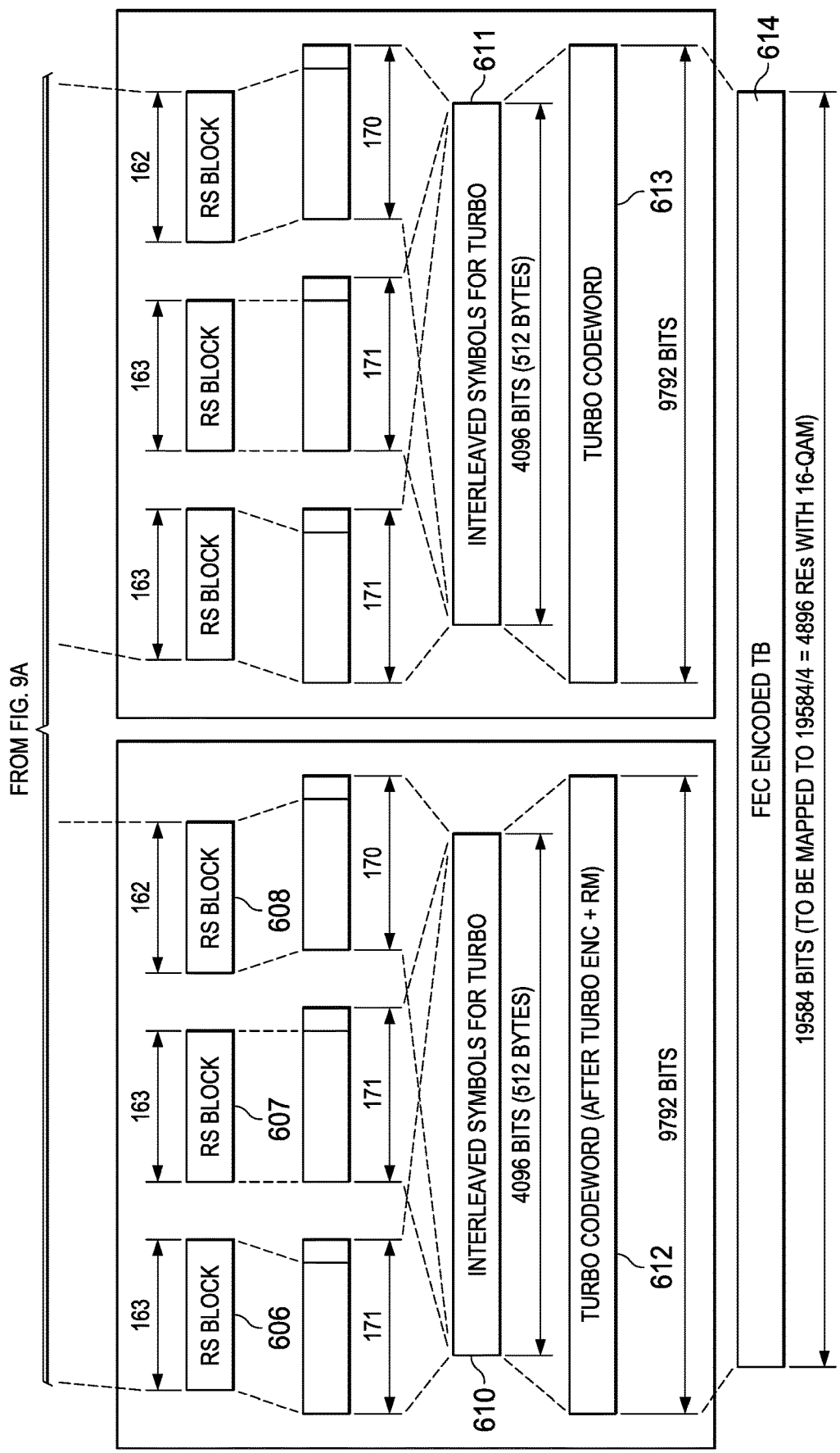

FIGS. 9A-9B together are a schematic that illustrates another FEC segmentation and configuration arrangement that is similar to FIG. 6. In this example, a CRC field 905 is generated for received transport block 902. After generating and appending the 24 bit CRC, k_tb=7760 bits, which is 970 bytes, as illustrated at 904. CRC augmented block 904 may then be segmented to form two FEC blocks 920, 921, for example. Additionally, in this example, a CRC field 925 and 926 may be generated for FEC blocks 920, 921 and appended to form augmented FEC blocks 922, 923. MCS calculation and encoding processing may then proceed in a similar manner as described above with regard to FIG. 6. Note that the size of transport block 902 has been adjusted with respect to transport block 602 by the higher level control logic to accommodate the additional CRC fields 925, 926. In other embodiments, additional or different arrangements of CRC fields may be added to various blocks to further improve error detection.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the disclosure should not be considered limited to the specific ordering of steps shown in the figures and/or described herein.

It is therefore contemplated that the appended claims will cover any such modifications of the embodiments as fall within the true scope and spirit of the disclosure.

What is claimed is:

1. A method comprising:
receiving a transport block of data for transmission having a transport block size;
receiving a set of parameters that define a target code rate;
determining a number N of an inner code blocks needed to transmit the transport block;
determining a number M of outer code blocks based on the number of inner code blocks and on the set of parameters that define the target code rate;
dividing the received transport block into M outer blocks and encoding each of the outer code blocks to form M encoded outer code blocks;
segmenting the M encoded outer code blocks into N inner code blocks and encoding the N inner code blocks to form N encoded inner blocks; and
arranging the N encoded inner code blocks to form an encoded transport block.

2. The method of claim 1, further including generating a CRC field for the received transport block and appending the CRC field to the received transport block, wherein dividing the received transport block into M outer blocks includes dividing the CRC field.

3. The method of claim 1, further including interleaving the M encoded outer blocks prior to segmenting into N inner blocks.

4. The method of claim 1, in which determining the number N of the inner code block includes calculating a largest inner code block size based on a specified set of implementation constraints.

5. The method of claim 1, in which codes for encoding each outer code block are obtained from a single mother code having a set of encoding parameters.

6. The method of claim 1, further comprising performing rate matching of the outer code blocks by applying code shortening to a mother code based on calculating an amount to shorten the mother code to form M shortened outer code blocks using the received set of parameters that define a target code rate.

7. The method of claim 6, further including calculating an amount to adjust a length of one or more of the M shortened outer code blocks required to eliminate padding bits.

8. The method of claim 1, in which the number N of inner code blocks is determined by receiving the number N as a parameter.

9. The method of claim 1, further comprising performing rate matching of the inner code blocks to form N encoded inner code blocks using the received set of parameters that define a target code rate.

10. The method of claim 9, further including calculating an amount to adjust a length of one or more of the N encoded inner code blocks required to eliminate padding bits.

11. The method of claim 1, further including transmitting the encoded transport block and transmitting the number N and the number M along with the encoded transport block.

12. The method of claim 1, in which the one or more parameters that define a target code rate include a scheduled allocation size and a modulation order.

13. The method of claim 12, further including calculating encoding parameters for the inner code blocks in accordance with the scheduled allocation size and modulation order parameters.

14. The method of claim 12, in which encoding the M outer code blocks performs Reed Solomon coding, or BCH coding and in which encoding the N inner code blocks performs turbo coding or convolutional coding.

15. The method of claim 1, further including:
segmenting the received transport block into two or more forward error correction (FEC) blocks;
generating and appending a CRC field to each of the two or more FEC blocks.

16. A method comprising:
receiving and demodulating an encoded transport block having N encoded inner block formed by M encoded outer code blocks;
receiving a set of parameters that define a target code rate and a transport block size;
determining the number N of an inner code blocks needed to transmit the transport block;
determining the number M of outer code blocks based on the number of inner code blocks and on the set of parameters that define the target code rate;
decoding the N inner code blocks in the encoded transport block to form M encoded inner code blocks; and
decoding the M encoded inner code blocks.

17. A system for wirelessly transmitting data, the system comprising:
data producing logic;
a transmitter coupled to receive data from the data producing logic,
control logic coupled to the data producing logic and to the transmitter;
wherein the transmitter includes:
a processor;
outer coding logic coupled to the processor operable to encode a block of data using a first type of encoding;
inner coding logic coupled to the processor operable to encode a block of data using a second type of encoding;
transmitter logic controllably coupled to the processor operable to wirelessly transmit encoded transport blocks of data; and
a non-transitory computer readable medium coupled to the processor storing software instructions that, when executed by the processor, cause a method for performing wireless communication using code block segmentation and configuration with concatenated forward error correction encoding to be performed, the method comprising:
determining a number N of a inner code blocks needed to transmit a transport block of data received from the data producing logic;
determining a number M of outer code blocks based on the number of inner code blocks and on a set of parameters received from the control logic that define the target code rate;
dividing the received transport block into M outer blocks and encoding each of the outer code blocks by the outer coding logic to form M encoded outer code blocks; and
segmenting the M encoded outer code blocks into N inner code blocks and encoding the N inner code blocks by the inner coding logic to form N encoded inner blocks.

18. The system of claim 17, further comprising performing rate matching of the outer code blocks by applying code shortening to a mother code based on calculating an amount to shorten the mother code to form M shortened outer code blocks using the received set of parameters that define a target code rate.

19. The system of claim 18, further including calculating an amount to adjust a length of one or more of the M shortened outer code blocks required to eliminate padding bits.

20. The system of claim 17, in which calculating the number N of the inner code blocks further includes performing rate matching of the inner code blocks to form N encoded inner code blocks using the received set of parameters that define a target code rate.

* * * * *